(12) United States Patent
Watanabe

(10) Patent No.: US 12,027,378 B2
(45) Date of Patent: Jul. 2, 2024

(54) METHOD OF MANUFACTURING SEMICONDUCTOR DEVICE HAVING STACKS ON WAFER

(71) Applicant: Kioxia Corporation, Tokyo (JP)

(72) Inventor: Takashi Watanabe, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 277 days.

(21) Appl. No.: 17/463,913

(22) Filed: Sep. 1, 2021

(65) Prior Publication Data

US 2022/0108895 A1 Apr. 7, 2022

(30) Foreign Application Priority Data

Oct. 5, 2020 (JP) ................. 2020-168325

(51) Int. Cl.
*H01L 21/48* (2006.01)
*H01L 21/02* (2006.01)
*H01L 21/321* (2006.01)
*H01L 21/768* (2006.01)

(52) U.S. Cl.
CPC .... *H01L 21/4857* (2013.01); *H01L 21/02164* (2013.01); *H01L 21/0217* (2013.01); *H01L 21/3212* (2013.01); *H01L 21/76804* (2013.01); *H01L 21/76877* (2013.01); *H01L 21/76895* (2013.01)

(58) Field of Classification Search
CPC ........... H01L 21/3212; H01L 21/32125; H01L 21/31053; H01L 21/02164; H01L 21/0217; H01L 2224/27616; H01L 2224/27845; H01L 2224/8003; H01L 2224/80031; H01L 2224/80047; H10B 43/00–50; H10B 41/00–70
See application file for complete search history.

(56) References Cited

U.S. PATENT DOCUMENTS

| | | | |
|---|---|---|---|
| 8,912,593 B2 | 12/2014 | Matsuda | |
| 10,529,233 B1 | 1/2020 | Vieten et al. | |
| 2012/0149185 A1* | 6/2012 | Kim | H10B 43/40 257/E21.294 |
| 2016/0293728 A1* | 10/2016 | Seo | G03F 7/2002 |
| 2017/0077122 A1 | 3/2017 | Ono | |
| 2020/0144242 A1* | 5/2020 | Park | H10B 41/50 |
| 2020/0357811 A1* | 11/2020 | Kim | H10B 41/35 |
| 2020/0411542 A1* | 12/2020 | Yang | H10B 41/50 |
| 2021/0225870 A1* | 7/2021 | Yang | H01L 23/5226 |

* cited by examiner

*Primary Examiner* — Steven M Christopher
*Assistant Examiner* — Tyler J Wiegand
(74) *Attorney, Agent, or Firm* — Oblon, McClelland, Maier & Neustadt, L.L.P.

(57) ABSTRACT

A method of manufacturing a semiconductor device, includes: alternately stacking a first film and a second film on a surface of a semiconductor substrate to form a multi-layer film; partially removing the multilayer film to form stacks and a depression between one of the stacks and another one of the stacks and expose an end portion of the surface; forming a first insulating film to fill the depression; forming a first protective film on the stacks, the first insulating film, and the end portion; forming a second insulating film on the first protective film, the second insulating film overlapping at least a part of the other one of the stacks and the end portion; and removing the second insulating film in a thickness direction using chemical mechanical polishing.

18 Claims, 18 Drawing Sheets

METHOD OF MANUFACTURING SEMICONDUCTOR DEVICE HAVING STACKS ON WAFER

CROSS-REFERENCE TO RELATED APPLICATION

This application is based upon and claims the benefit of priority from Japanese Patent Application No. 2020-168325, filed on Oct. 5, 2020; the entire contents of which are incorporated herein by reference.

FIELD

Embodiments relate to a method of manufacturing a semiconductor device.

BACKGROUND

Regarding the method of manufacturing a semiconductor device such as a three-dimensional memory, there has been known a method of manufacturing a semiconductor device by bonding a first semiconductor substrate with a memory cell and a second semiconductor substrate with a peripheral circuit together.

DETAILED DESCRIPTION

Figure 1:
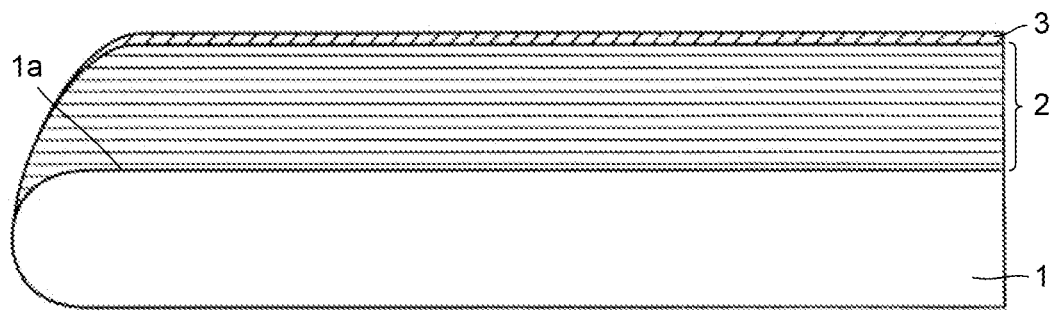
FIG. 1 is a schematic cross-sectional view for explaining an example of a method of manufacturing a semiconductor device in a first embodiment.
Figure 1:
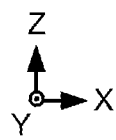

A method of manufacturing a semiconductor device, includes: alternately stacking a first film and a second film on a surface of a semiconductor substrate to form a multilayer film; partially removing the multilayer film to form stacks and a depression between one of the stacks and another one of the stacks and expose an end portion of the surface; forming a first insulating film to fill the depression; forming a first protective film on the stacks, the first insulating film, and the end portion; forming a second insulating film on the first protective film, the second insulating film overlapping at least a part of the other one of the stacks and the end portion; and removing the second insulating film in a thickness direction using chemical mechanical polishing.

Embodiments will be hereinafter explained with reference to the drawings. The relation between the thickness and the planer dimension of each constituent element, a thickness ratio among the constituent elements, and so on illustrated in the drawings may be different from actual ones. Further, in the embodiments, substantially the same constituent elements are denoted by the same reference numerals and symbols, and explanation thereof will be appropriately omitted.

First Embodiment

FIG. 1 to FIG. 18 are schematic cross-sectional views for explaining an example of a method of manufacturing a semiconductor device in a first embodiment, illustrating a part of an X-Z cross-section including an X-axis of a semiconductor substrate 1 and a Z-axis perpendicular to the X-axis and perpendicular to a Y-axis perpendicular to the X-axis.

First, as illustrated in FIG. 1, on a surface 1a of the semiconductor substrate 1, a multilayer film 2 is formed, and on the multilayer film 2, a protective film 3 is formed. Another layer may be provided between the surface 1a and the multilayer film 2.

Examples of the semiconductor substrate 1 include a silicon wafer. An example of the multilayer film 2 is formed by alternately stacking a first film, such as a silicon oxide film having a thickness of 25 nm, and a second film, such as a silicon nitride film having a thickness of 25 nm. The second film is a sacrificial layer. The sacrificial layer is a region where a conductive layer is to be formed later. The number of layers of the first film and the second film is not limited in particular.

The protective film 3 is provided in order to protect the multilayer film 2 against etching, for example. Examples of the protective film 3 include a silicon nitride film having a thickness of 100 nm.

Figure 2:
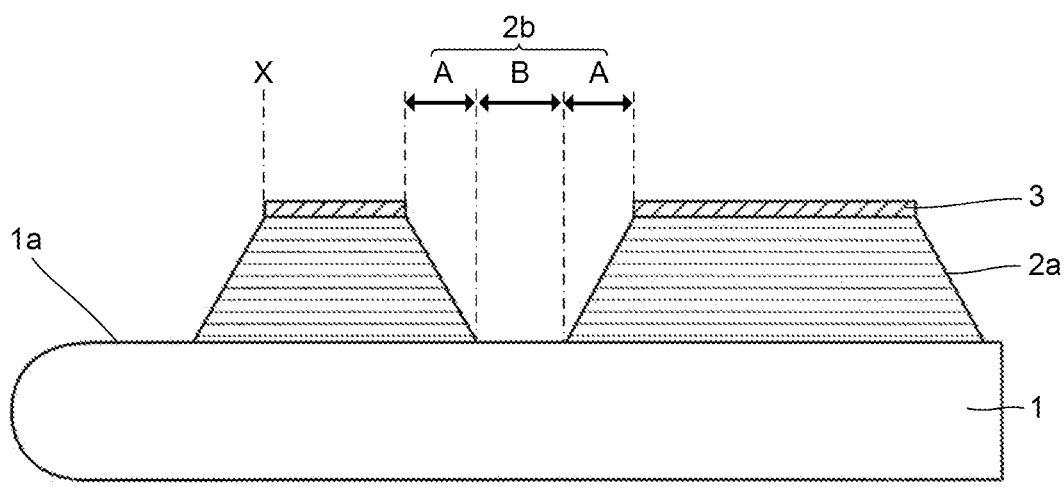
FIG. 2 is a schematic cross-sectional view for explaining the example of the method of manufacturing the semiconductor device in the first embodiment.
Figure 2:
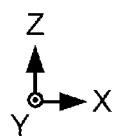

Then, as illustrated in FIG. 2, the multilayer film 2 and the protective film 3 are partially removed to form a plurality of stacks 2a and a depression 2b that is provided between one of the stacks 2a and another one of the stacks 2a and is adjacent to the stacks 2a. The stack 2a is a region where a memory cell of a three-dimensional memory is formed.

The partial removal of the multilayer film 2 forms step regions A in the stacks 2a, the step regions being for forming a contact between the conductive layer to be formed later and a wiring. The step region A is formed by forming a resist mask on the multilayer film 2 and alternately switching between a step of partially removing the first film and the second film by anisotropic etching and a step of reducing the resist mask by isotropic etching, for example. At this time, the multilayer film 2 is removed also in a region B between a pair of the step regions A. A peripheral circuit of the three-dimensional memory may be formed in the region B. The region B may be provided adjacent to only one step region A.

The formations of the stack 2a and the depression 2b are performed together with multilayer film edge cutting, which partially removes the multilayer film 2 to expose an end portion of the surface 1a of the semiconductor substrate 1, as illustrated in FIG. 2. The multilayer film edge cutting partially removes the multilayer film 2 toward the end portion of the surface 1a of the semiconductor substrate 1 starting from a multilayer film edge cut end X on the top surface of the stack 2a located on the most end portion side, to expose the end portion of the surface 1a of the semiconductor substrate 1. This prevents generation of particles at the end portion of the surface 1a. The width of the stack 2a on the most end portion side may be shorter than that of the other stacks 2a. The length between the end portion of the semiconductor substrate 1 and the multilayer film edge cut end X is not limited in particular, but is 1.5 mm or more and 3.0 mm or less, for example. The stack 2a on the most end portion side may be provided at a plurality of locations along the peripheral edge of the surface 1a, for example.

Figure 3:
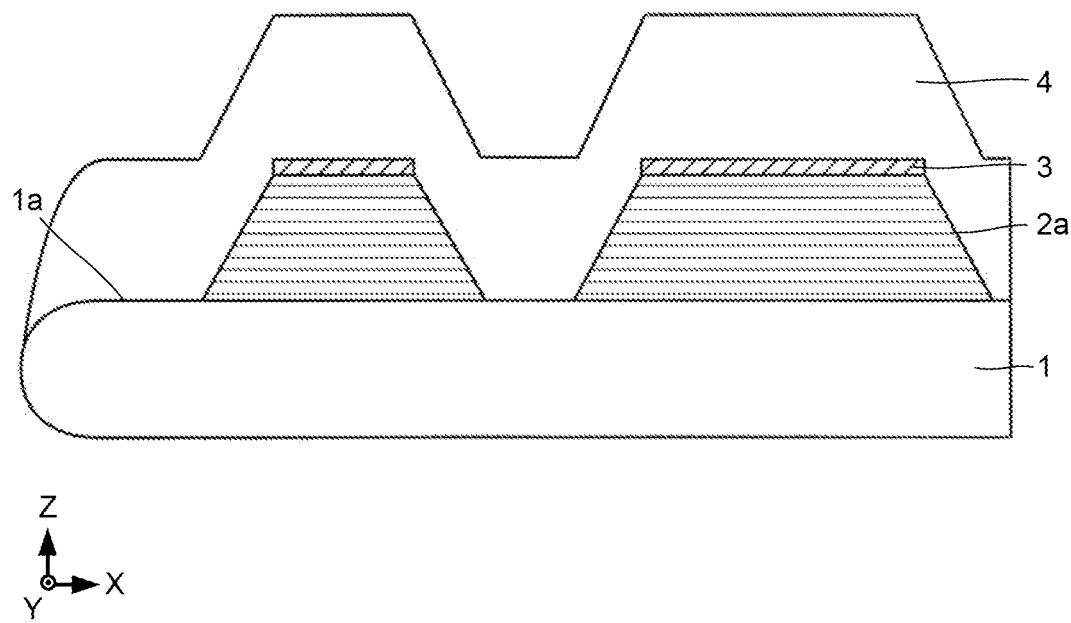
FIG. 3 is a schematic cross-sectional view for explaining the example of the method of manufacturing the semiconductor device in the first embodiment.

Then, as illustrated in FIG. 3, an insulating film 4 is formed on the stacks 2a, the depression 2b, and the end portion of the surface 1a. The insulating film 4 is an embedded insulating film that fills the depression 2b. Examples of the insulating film 4 include a silicon oxide film having a thickness of 3.3 μm.

Figure 4:
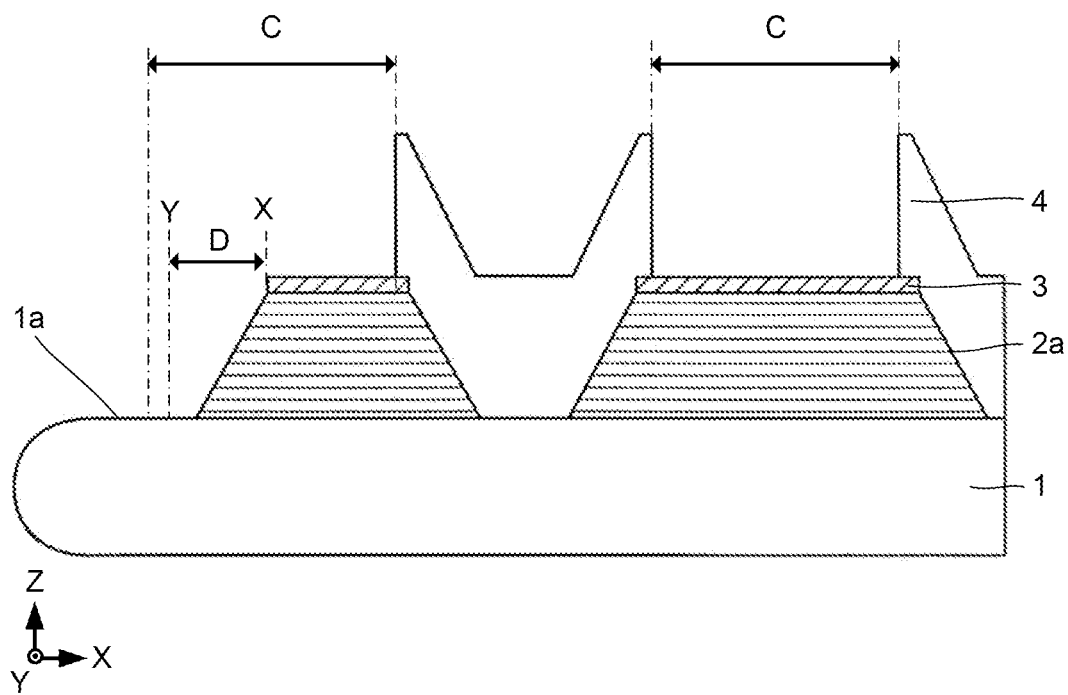
FIG. 4 is a schematic cross-sectional view for explaining the example of the method of manufacturing the semiconductor device in the first embodiment.

A region on the protective film 3 of the insulating film 4 is removed in a memory cell formation region C overlapping the stack 2a by a photolithography process and an etching process. At this time, in order to prevent the generation of particles at the end portion of the surface 1a, as illustrated in FIG. 4, edge cutting of the insulating film 4 is performed simultaneously at an insulating film edge cut end Y that is further located on the end portion side from the multilayer film edge cut end X. At this time, in a region D between the multilayer film edge cut end X and the insulating film edge cut end Y, the insulating film 4 is removed even though the multilayer film 2 has already been removed in the memory cell formation region C.

Figure 5:
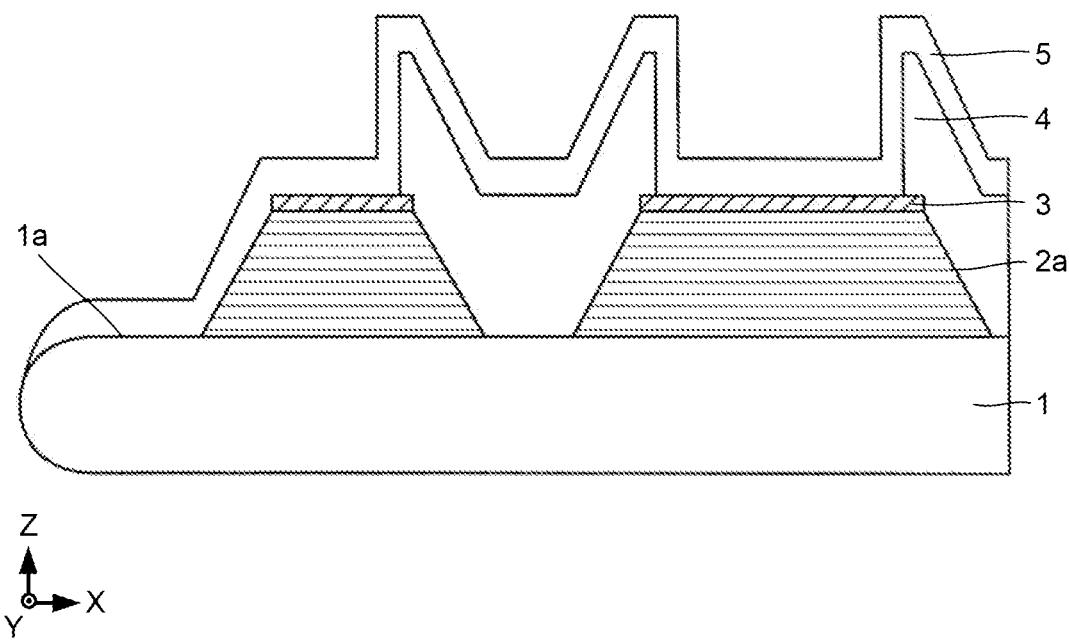
FIG. 5 is a schematic cross-sectional view for explaining the example of the method of manufacturing the semiconductor device in the first embodiment.

Then, as illustrated in FIG. 5, an insulating film 5 is formed on the stacks 2a, the insulating film 4, and the end portion of the surface 1a. The insulating film 5 is provided in order to thicken the insulating film on the protective film 3, for example. Examples of the insulating film 5 include a silicon oxide film having a thickness of 500 nm.

Figure 6:
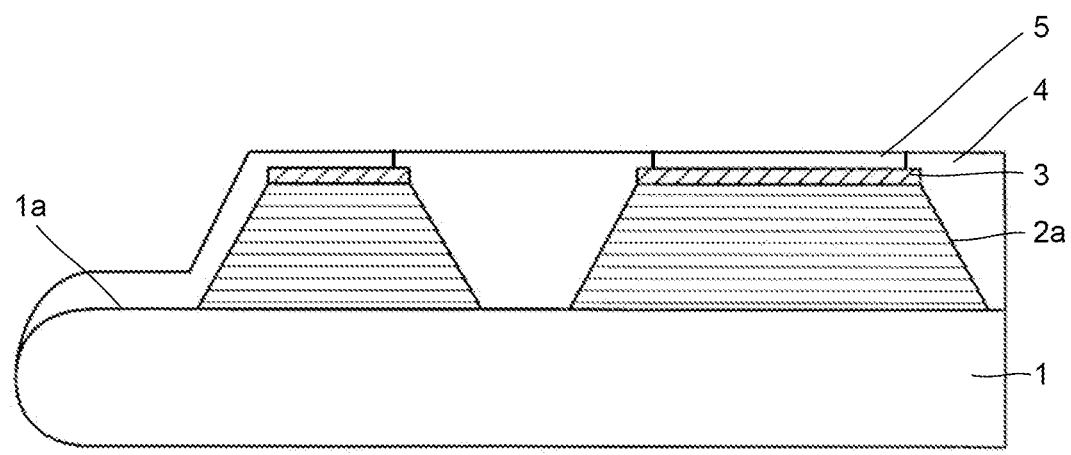
FIG. 6 is a schematic cross-sectional view for explaining the example of the method of manufacturing the semiconductor device in the first embodiment.

Then, as illustrated in FIG. 6, using CMP, the insulating film 5 is partially removed along the thickness direction (Z-axis direction) until the thickness of the insulating film 5 in the region on the stack 2a becomes 200 nm, for example, to flatten the top surface of the insulating film 5. The removal is not limited to this, but the insulating film 5 may be removed partially until the top surface of the protective film 3 is exposed.

Figure 7:
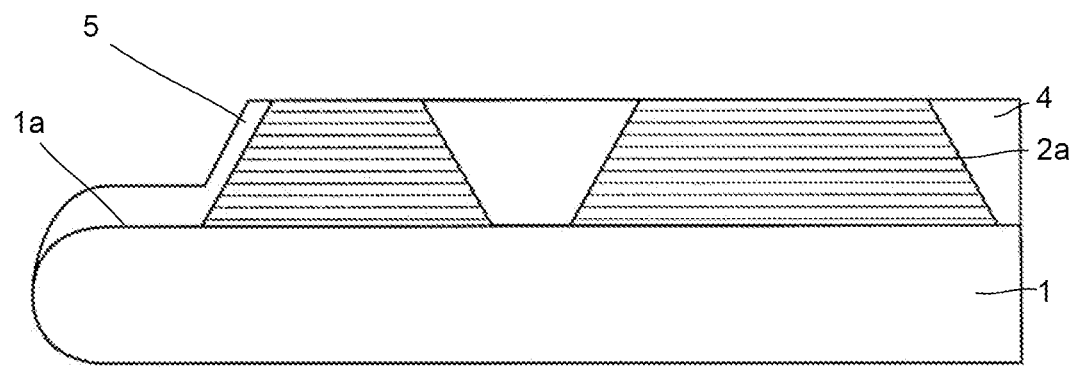
FIG. 7 is a schematic cross-sectional view for explaining the example of the method of manufacturing the semiconductor device in the first embodiment.

Then, as illustrated in FIG. 7, the region on the stacks 2a of the insulating film 5, and the protective film 3 are removed, to thereby make the top surfaces of the stacks 2a exposed. The region on the stack 2a of the insulating film 5, and the protective film 3 can be removed by using dry etching, for example.

Figure 8:
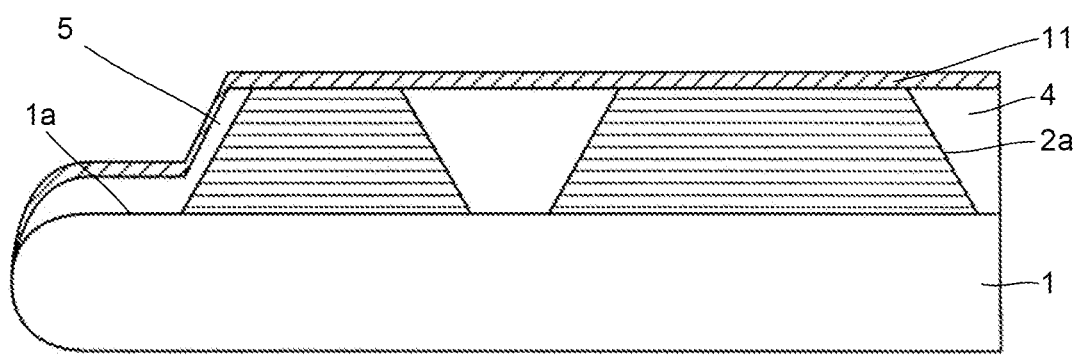
FIG. 8 is a schematic cross-sectional view for explaining the example of the method of manufacturing the semiconductor device in the first embodiment.

Then, as illustrated in FIG. 8, a protective film 11 is formed on the stacks 2a, the insulating film 4 embedded in the depression 2b, and the insulating film 5 on the end portion of the surface 1a. The protective film 11 is provided in order to protect the stacks 2a, the insulating film 4, and the insulating film 5 against working using CMP, for example. An example of the protective film 11 includes a silicon nitride film having a thickness of 100 nm.

Figure 9:
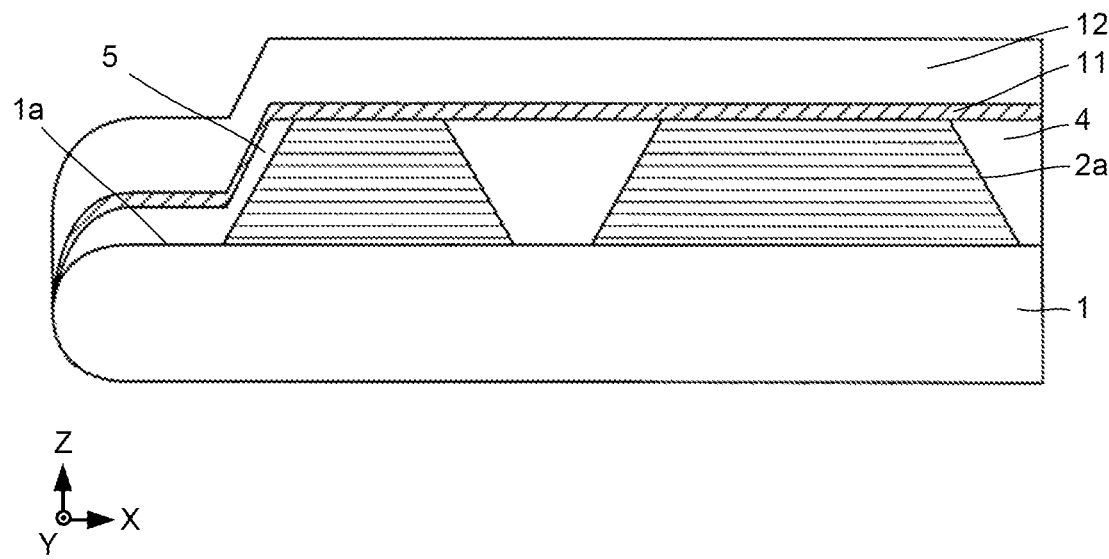
FIG. 9 is a schematic cross-sectional view for explaining the example of the method of manufacturing the semiconductor device in the first embodiment.

Then, as illustrated in FIG. 9, an insulating film 12 is formed on the protective film 11. The insulating film 12 overlaps the end portion of the surface 1a of the semiconductor substrate 1 and the stacks 2a. An example of the insulating film 12 includes a silicon oxide film having a thickness of 3.0 μm.

Figure 10:
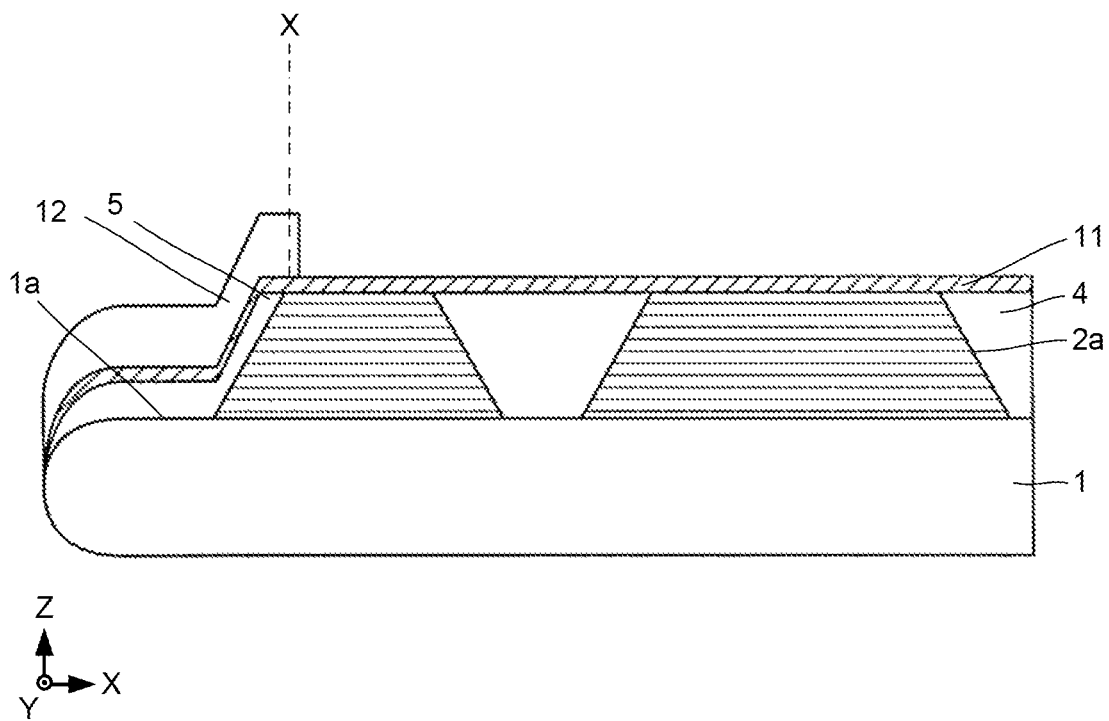
FIG. 10 is a schematic cross-sectional view for explaining the example of the method of manufacturing the semiconductor device in the first embodiment.

Then, as illustrated in FIG. 10, on the surface of the protective film 11, a mask is formed in a region from the region overlapping the end portion of the surface 1a to a region on the inner side from the multilayer film edge cut end X, and then the insulating film 12 on the protective film 11 is removed by an etching process to leave the insulating film 12 on at least a part of one of the stacks 2a and on the end portion of the surface 1a.

Figure 11:
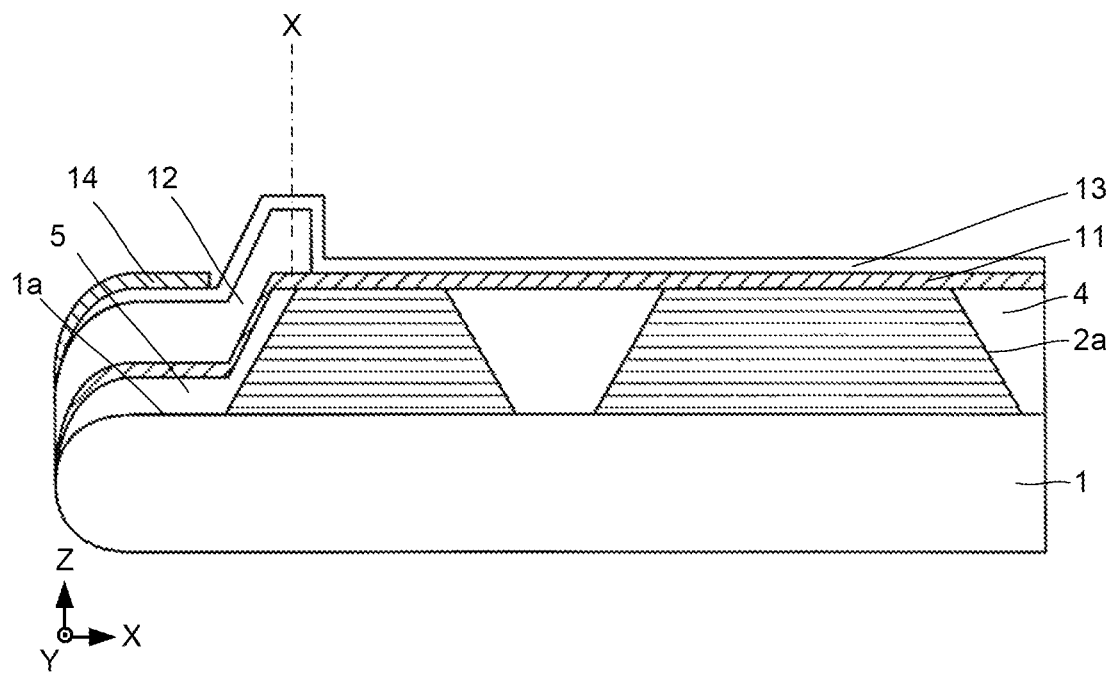
FIG. 11 is a schematic cross-sectional view for explaining the example of the method of manufacturing the semiconductor device in the first embodiment.

Then, as illustrated in FIG. 11, an insulating film 13 is formed on the protective film 11 and the insulating film 12, and on the end portion side from the multilayer film edge cut end X, a protective film 14 that overlaps the end portion of the surface 1a and does not overlap the stacks 2a is formed. Examples of the insulating film 13 include a silicon oxide film having a thickness of 100 nm, for example. The protective film 14 is provided in order to protect the insulating film 12 and the insulating film 13 against working using CMP, for example. Examples of the protective film 14 include a silicon nitride film having a thickness of 100 nm. The height of a part of the top surface of the protective film 14 from the surface 1a of the semiconductor substrate 1 is preferred to be the same as the height of a part of the top surface of the protective film 11 therefrom.

The protective film 14 is formed, for example, by forming a film such as silicon nitride film on the entire surface of the insulating film 13, and then forming a resist film only on the end portion of the surface 1a and removing a center portion of this film by dry etching. At this time, the protective film 11 is not removed because of being covered by the insulating film 13. Further, the protective film 14 can also be formed by a film-forming apparatus capable of forming a film only on the end portion of the surface 1a, and in this case, the insulating film 13 may be omitted.

Figure 12:
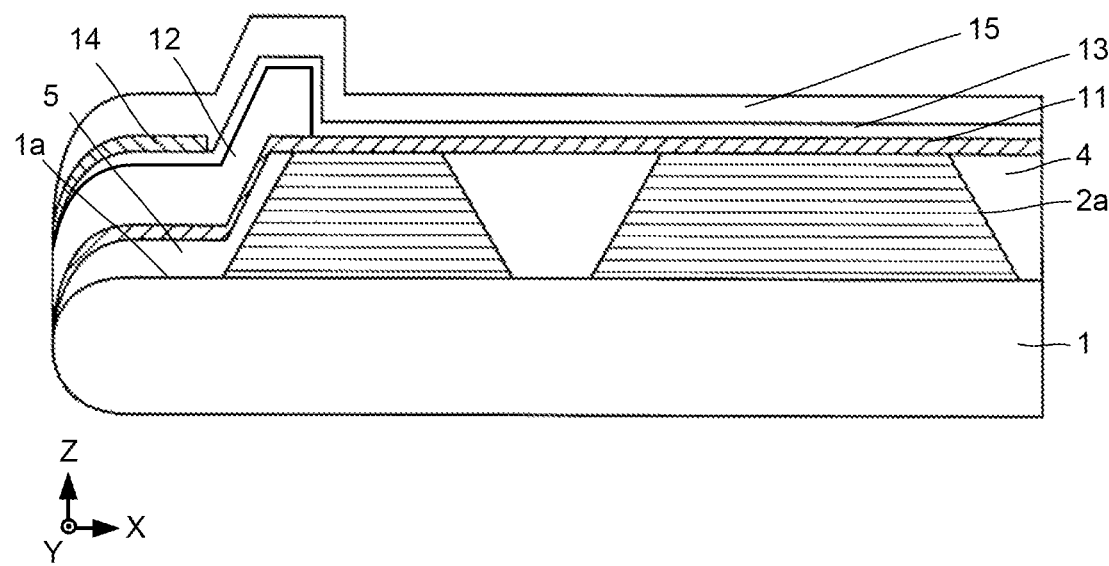
FIG. 12 is a schematic cross-sectional view for explaining the example of the method of manufacturing the semiconductor device in the first embodiment.

Then, as illustrated in FIG. 12, an insulating film 15 is formed on the insulating film 13 and the protective film 14. The insulating film 15 is provided in order to thicken the insulating film 13 on the protective film 14, for example. Examples of the insulating film 15 include a silicon oxide film having a thickness of 200 nm.

Figure 13:
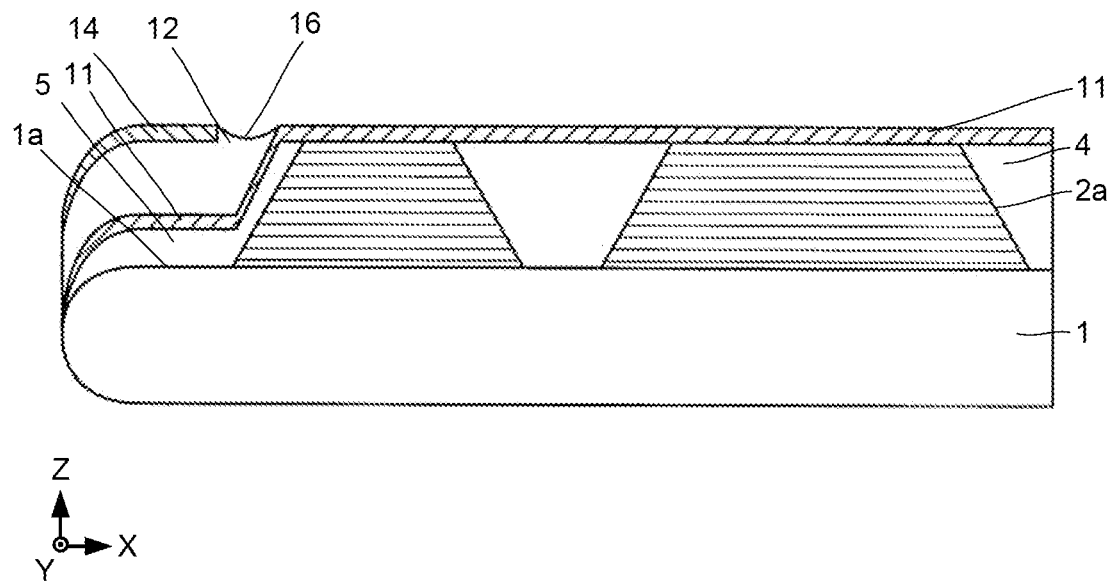
FIG. 13 is a schematic cross-sectional view for explaining the example of the method of manufacturing the semiconductor device in the first embodiment.

Then, as illustrated in FIG. 13, using CMP, the insulating film 12, the insulating film 13, and the insulating film 15 are partially removed along the thickness direction (Z-axis direction) until, for example, a part of the top surface of the protective film 11 and a part of the top surface of the protective film 14 are exposed. At this time, in an exposed portion of the top surface of the insulating film 12, small dishing 16 sometimes occurs between the protective film 11 and the protective film 14.

Figure 14:
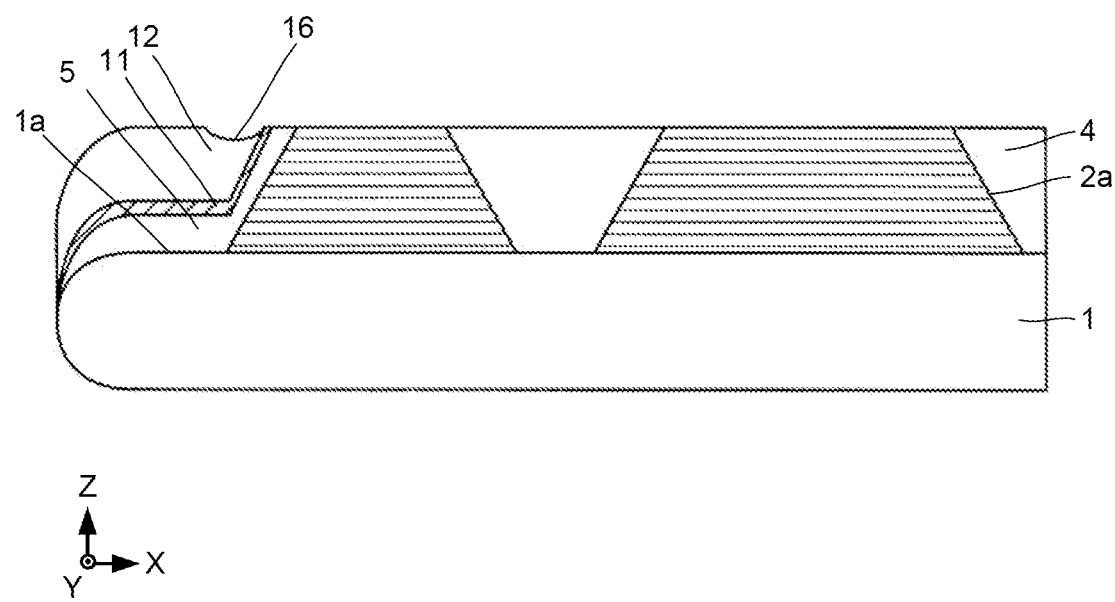
FIG. 14 is a schematic cross-sectional view for explaining the example of the method of manufacturing the semiconductor device in the first embodiment.

Then, as illustrated in FIG. 14, the protective film 11 on the stacks 2a and the protective film 14 are removed to make the top surfaces of the stacks 2a exposed. The protective film 11 and the protective film 14 are removed by using dry etching, for example.

Figure 15:
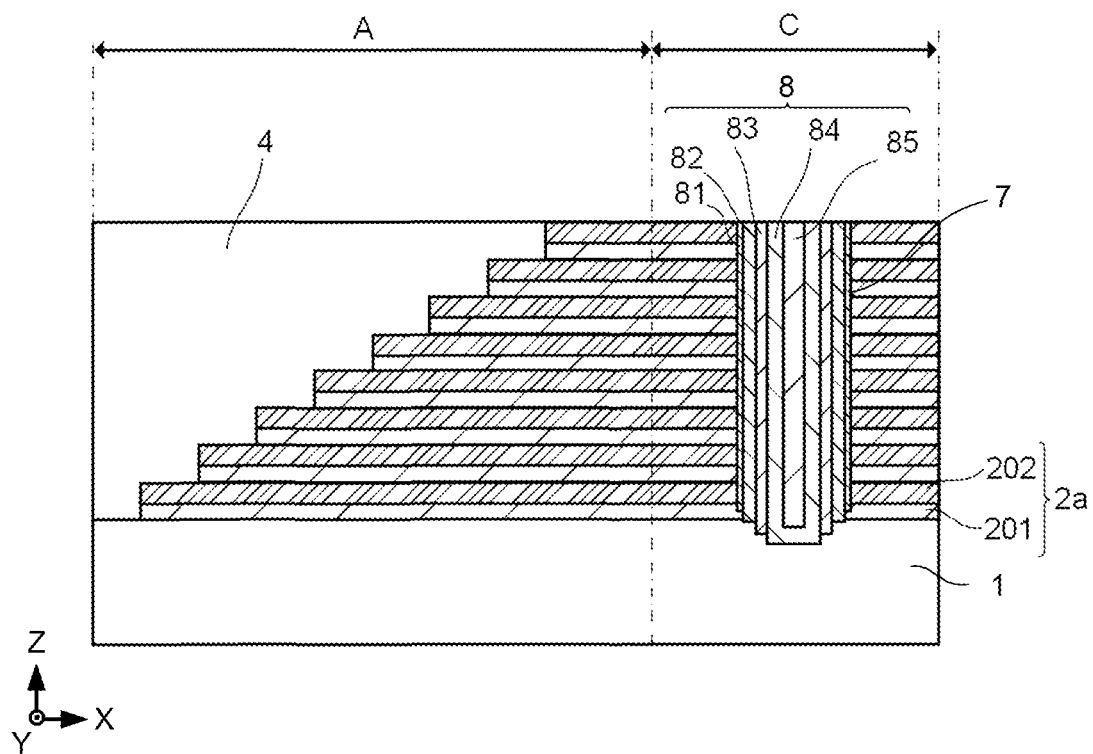
FIG. 15 is a schematic cross-sectional view for explaining the example of the method of manufacturing the semiconductor device in the first embodiment.

FIG. 15 illustrates a part of the step region A and the memory cell formation region C in an enlarged manner. Then, as illustrated in FIG. 15, a memory hole 7 is formed through the stack 2a of first films 201, such as a silicon oxide film, and second films 202, such as a silicon nitride film, and a memory layer 8 is formed in the memory hole 7. The memory layer 8 includes a block insulating film 81, a charge storage film 82, a tunnel insulating film 83, a semiconductor layer 84, and a core insulating layer 85.

The block insulating film 81, the tunnel insulating film 83, and the core insulating layer 85 contain silicon oxide, for example. The charge storage film 82 contains silicon nitride, for example. The semiconductor layer 84 contains polysilicon, for example.

The block insulating film 81, the charge storage film 82, and the tunnel insulating film 83 are stacked in order on the side surface of the memory hole 7. Then, the semiconductor layer 84 is formed so as to penetrate the stack 2a and have a side surface thereof in contact with the tunnel insulating film 83. The semiconductor layer 84 is in contact with the surface 1a of the semiconductor substrate 1 and is connected to a not-illustrated source line through the semiconductor substrate 1. The core insulating layer 85 is provided inside the semiconductor layer 84. The core insulating layer 85 extends along the semiconductor layer 84.

Figure 16:
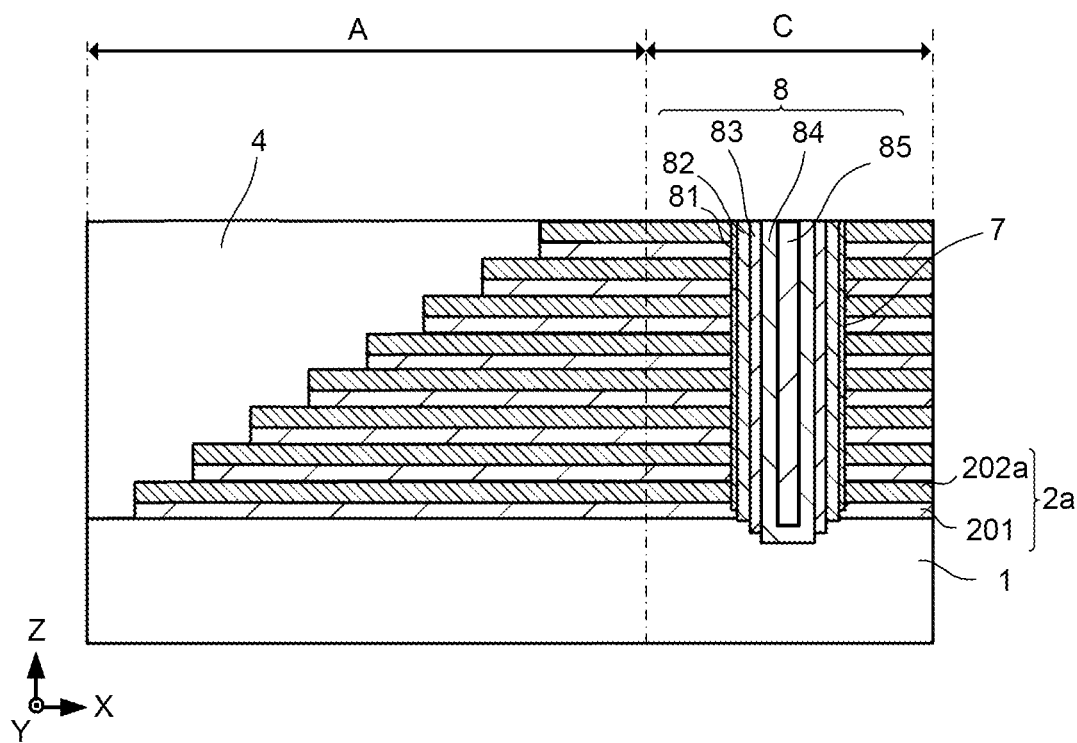
FIG. 16 is a schematic cross-sectional view for explaining the example of the method of manufacturing the semiconductor device in the first embodiment.

FIG. 16 illustrates a part of the step region A and the memory cell formation region C in an enlarged manner. Then, as illustrated in FIG. 16, the second films 202 are removed to form spaces, and a conductive layer 202a is formed in each of the spaces. The conductive layer 202a constitutes a word line of the memory cell. Examples of the conductive layer 202a include a metal layer.

Figure 17:
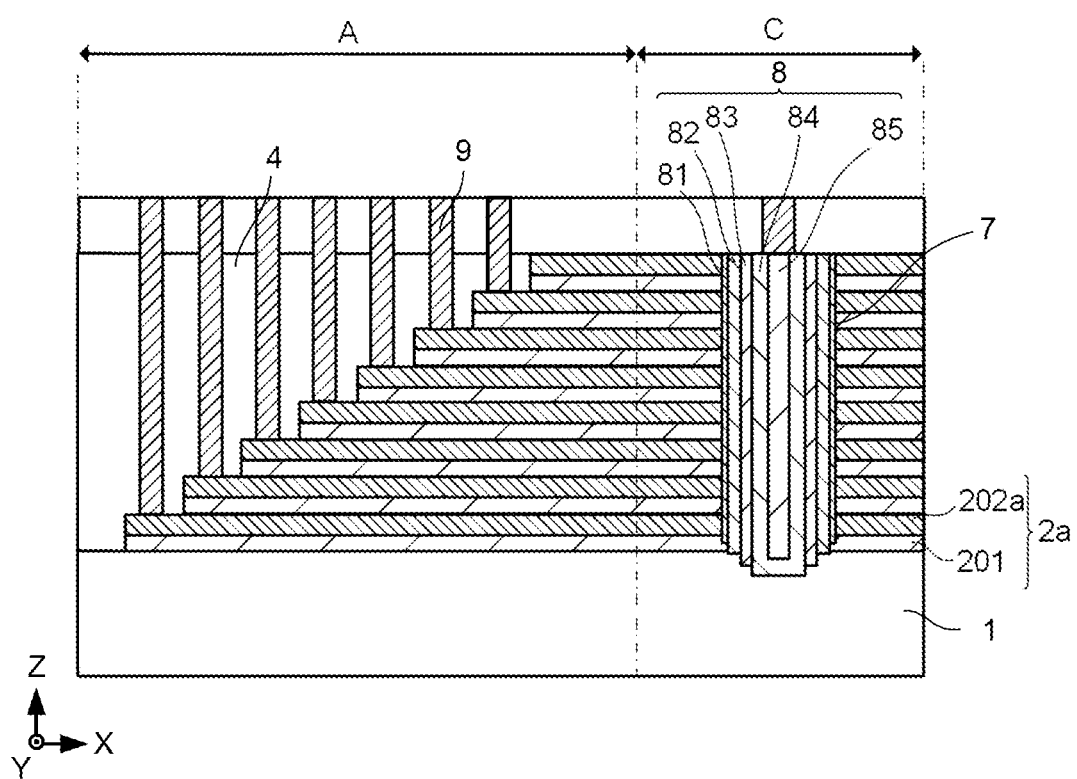
FIG. 17 is a schematic cross-sectional view for explaining the example of the method of manufacturing the semiconductor device in the first embodiment.

FIG. 17 illustrates a part of the step region A and the memory cell formation region C in an enlarged manner. Then, as illustrated in FIG. 17, contact layers 9 are formed. The contact layer 9 includes a contact plug connected to the conductive layer 202a in the step region A and a contact plug connected to the memory layer 8 in the memory cell formation region C. In the memory cell formation region C, a bit line is provided on top of the contact plug.

Figure 18:
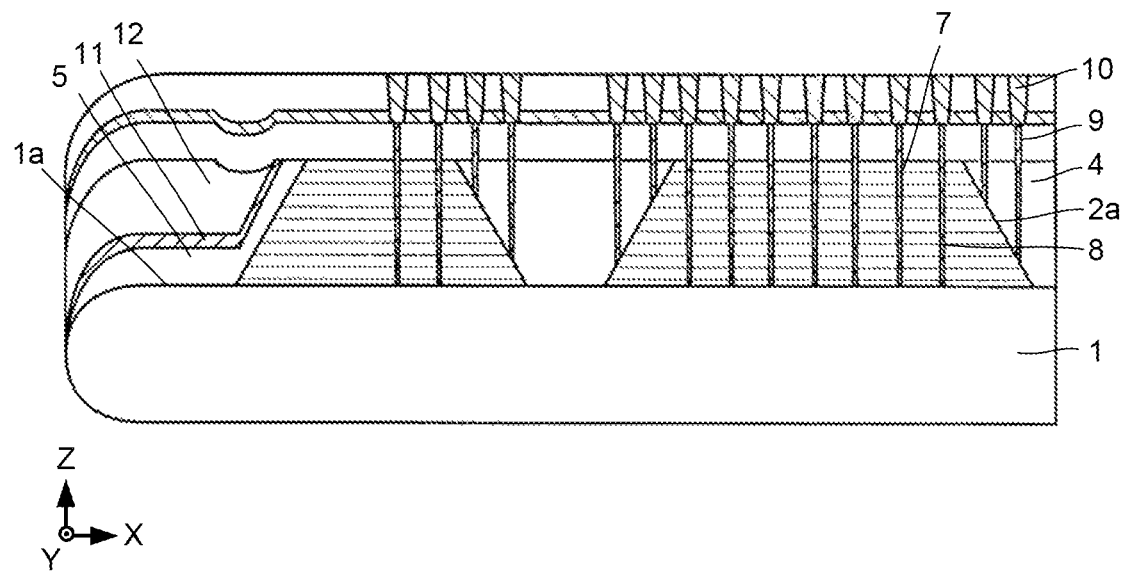
FIG. 18 is a schematic cross-sectional view for explaining the example of the method of manufacturing the semiconductor device in the first embodiment.

Then, as illustrated in FIG. 18, a wiring layer 10 is formed on each of the contact layers 9. A step caused by the dishing 16 is flattened during the CMP process when forming the contact layer 9 and wiring layer 10.

As above, in the example of the method of manufacturing the semiconductor device in this embodiment, forming the protective film 11 and the protective film 14 that overlap the end portion of the surface 1a of the semiconductor substrate 1 makes it possible to form a sufficiently thick insulating film at the end portion of the surface 1a of the semiconductor substrate 1.

Figure 19:
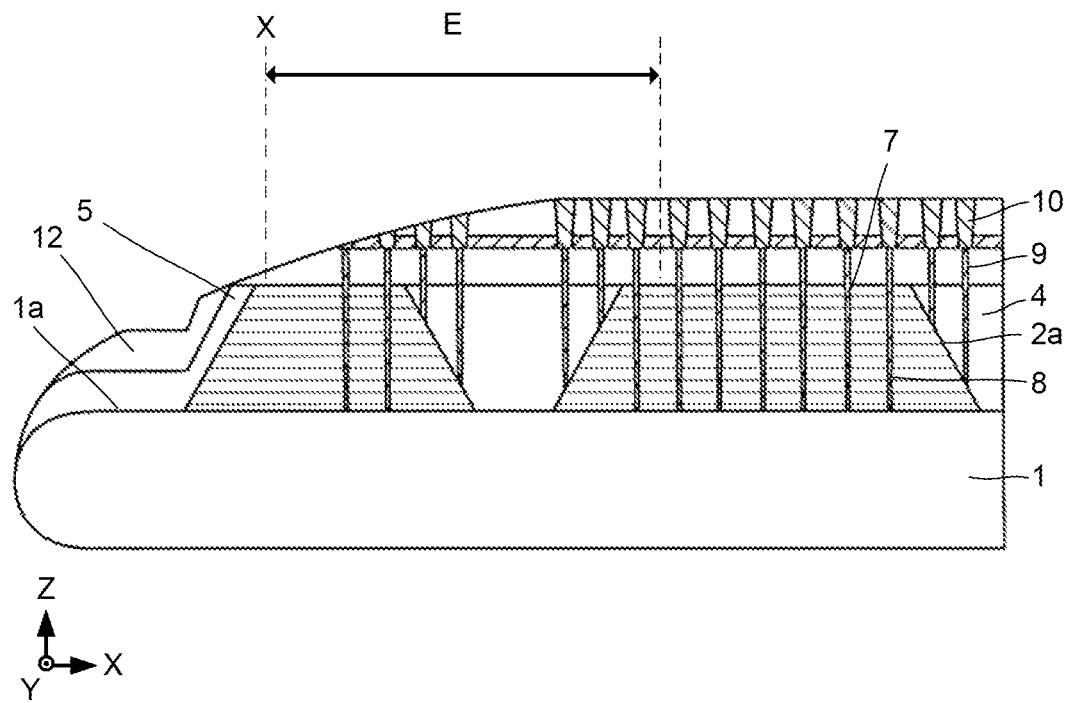
FIG. 19 is a schematic view illustrating an example of a structure of the semiconductor device manufactured without forming a protective film 11 or a protective film 14.

FIG. 19 is a schematic view illustrating an example of a structure of a semiconductor device manufactured without forming the protective film 11 or the protective film 14. In the case where neither the protective film 11 nor the protective film 14 is formed, the insulating film at the end portion of the surface 1a of the semiconductor substrate 1 is removed significantly. In this case, during the process of forming the contact layer 9 and the wiring layer 10, when CMP is performed, pressure is concentrated at the multilayer film edge cut end X and a roll-off region E is formed. When the roll-off region E is formed, focus shift (defocusing) occurs during exposure in the photolithography process when forming the contact layer 9 and the wiring layer 10, which are formed in the subsequent step, causing a decrease in yield at the end portion of the semiconductor substrate 1.

In contrast to this, in the method of manufacturing the semiconductor device in this embodiment, forming the protective film 11 and the protective film 14 allows the insulating film 12 to remain on the outer side from the multilayer film edge cut end X. This prevents the formation of the roll-off region E in the subsequent CMP process and prevent the decrease in yield caused by defocusing in the photolithography process. Further, forming the protective film 11 prevents the dishing in the CMP process. Accordingly, it is possible to provide a semiconductor device with high reliability.

Second Embodiment

FIG. 20 to FIG. 26 are views for explaining an example of a method of manufacturing a semiconductor device in a second embodiment. Explanations of the same parts as in the first embodiment are omitted here because the explanation of the first embodiment can be cited as appropriate.

Figure 20:
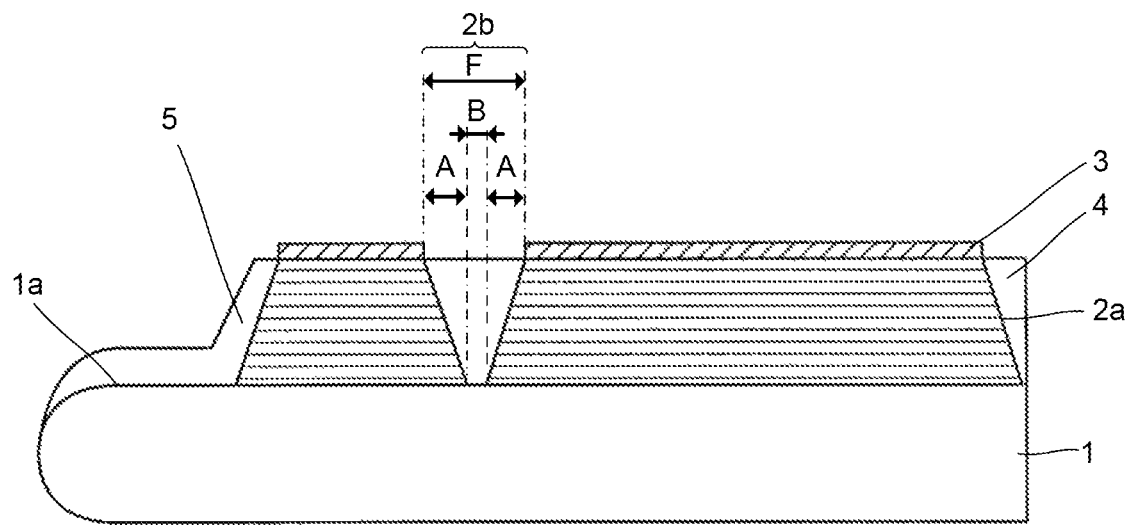
FIG. 20 is a view for explaining an example of a method of manufacturing a semiconductor device in a second embodiment.

First, the same steps as those illustrated in FIG. 1 to FIG. 7 are performed in the same manner as in the example of the method of manufacturing the semiconductor device in the first embodiment. Here, as an example, the protective film 3 on the stacks 2a is left without removal as illustrated in FIG. 20. Further, the depression 2b, the step region A, and the region B are each formed with a narrower width than in the first embodiment. Further, an interval F between the adjacent protective films 3 is also formed to be narrow.

Figure 21:
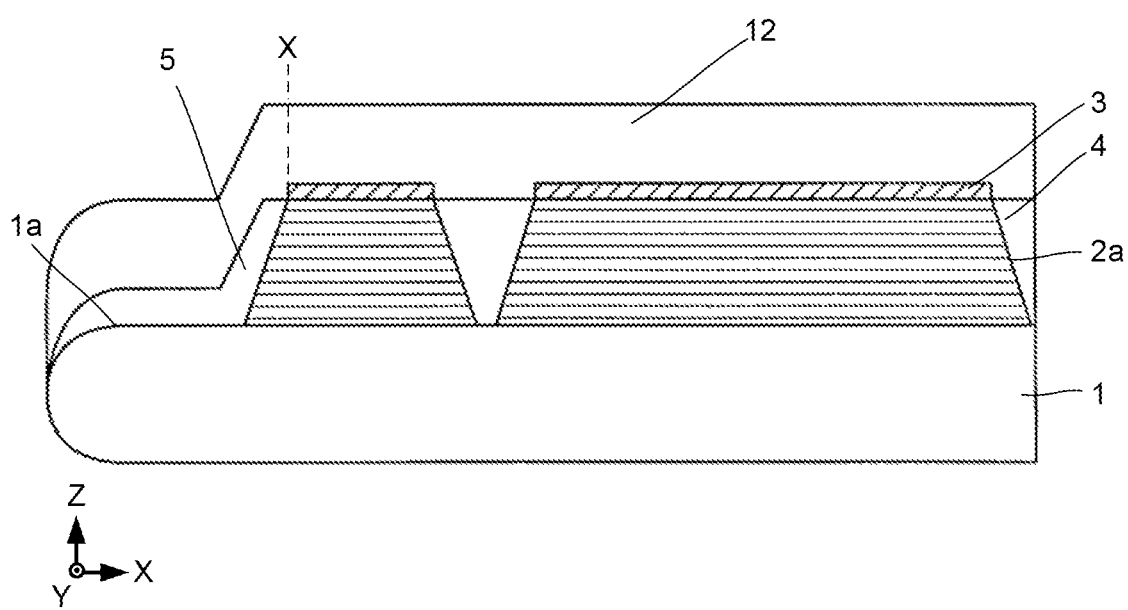
FIG. 21 is a view for explaining the example of the method of manufacturing the semiconductor device in the second embodiment.

Then, as illustrated in FIG. 21, the insulating film 12 is formed on the protective film 3, the insulating film 4, and the insulating film 5. Examples of the insulating film 12 include a silicon oxide film having a thickness of 2.9 μm, for example.

Figure 22:
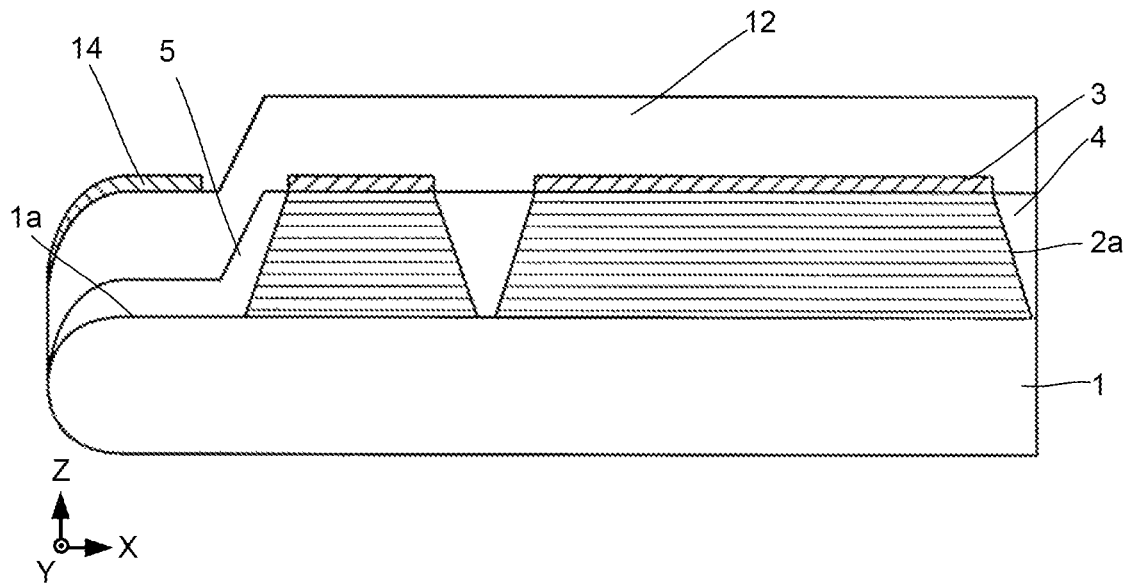
FIG. 22 is a view for explaining the example of the method of manufacturing the semiconductor device in the second embodiment.

Then, as illustrated in FIG. 22, the protective film 14 that overlaps the end portion of the surface 1a and does not overlap the stacks 2a is formed on the end portion side from the multilayer film edge cut end X. The protective film 14 is provided in order to protect a part of the insulating film 12 against working using CMP, for example. An example of the protective film 14 includes a silicon nitride film having a thickness of 100 nm, for example. The height of a part of the top surface of the protective film 14 from the surface 1a of the semiconductor substrate 1 is preferred to be the same as the height of a part of the top surface of the protective film 3 therefrom.

Figure 23:
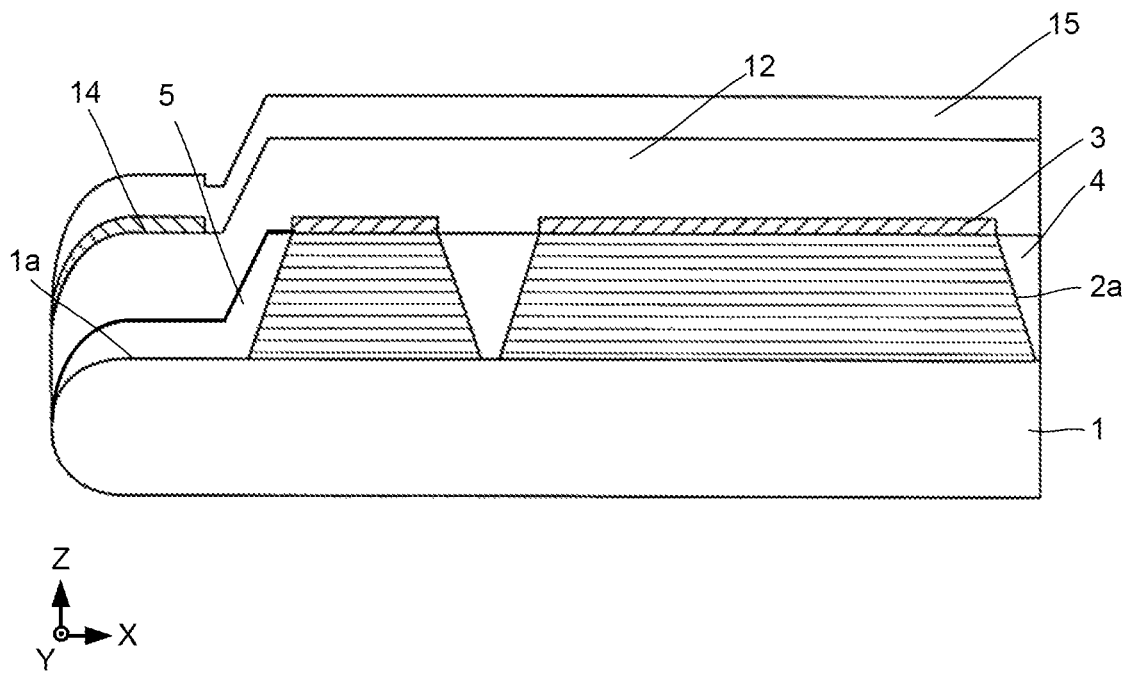
FIG. 23 is a view for explaining the example of the method of manufacturing the semiconductor device in the second embodiment.

Then, as illustrated in FIG. 23, the insulating film 15 is formed on the protective film 14 and the insulating film 12. Examples of the insulating film 15 include a silicon oxide film having a thickness of 300 nm.

Figure 24:
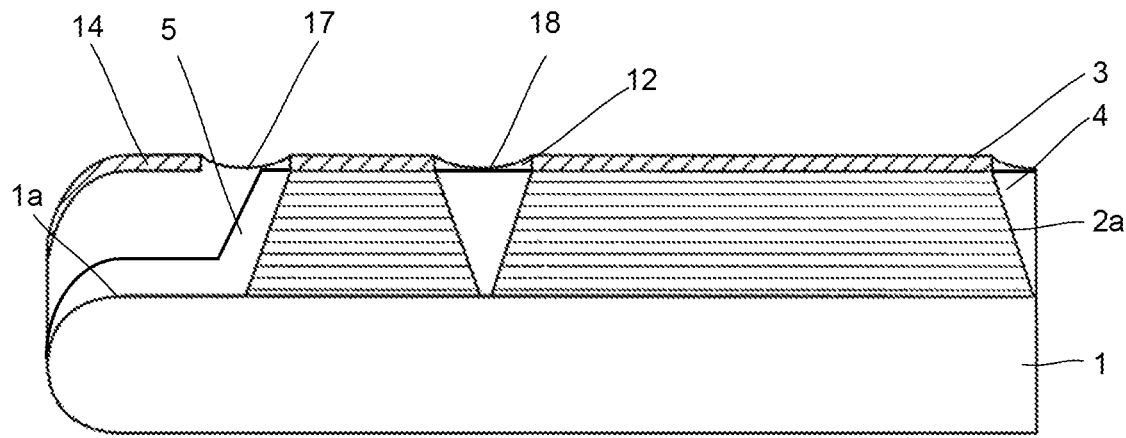
FIG. 24 is a view for explaining the example of the method of manufacturing the semiconductor device in the second embodiment.
Figure 24:
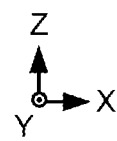

Then, as illustrated in FIG. 24, using CMP, the insulating film 12 and the insulating film 15 are partially removed along the thickness direction (Z-axis direction) until, for example, the top surface of the protective film 3 and the top surface of the protective film 14 are exposed. At this time, dishing 17 occurs in an exposed portion of the insulating film 12 between the protective film 3 and the protective film 14, and at the same time, dishing 18 occurs also in an exposed portion of the insulating film 12 between the adjacent protective films 3. However, narrowing of the interval F between the adjacent protective films 3 reduces the dishing 18.

Figure 25:
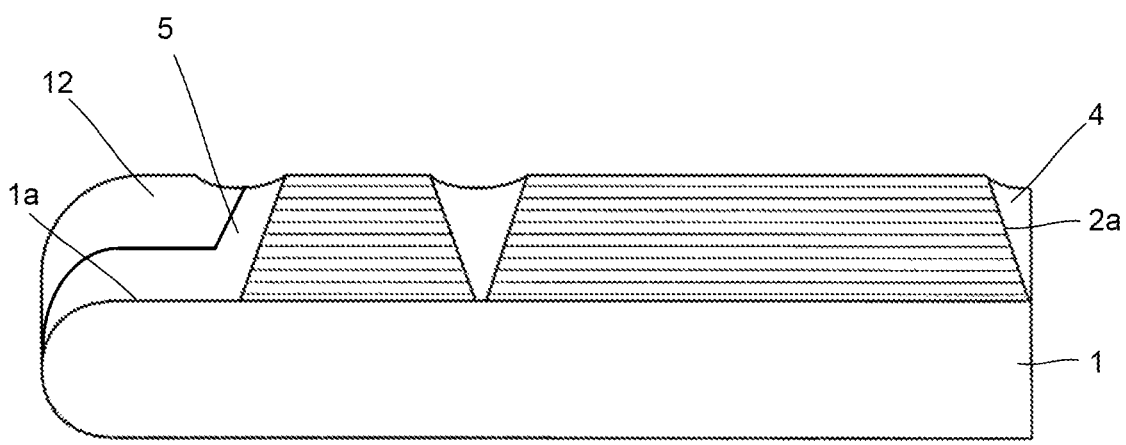
FIG. 25 is a view for explaining the example of the method of manufacturing the semiconductor device in the second embodiment.
Figure 25:
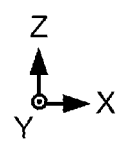
Figure 26:
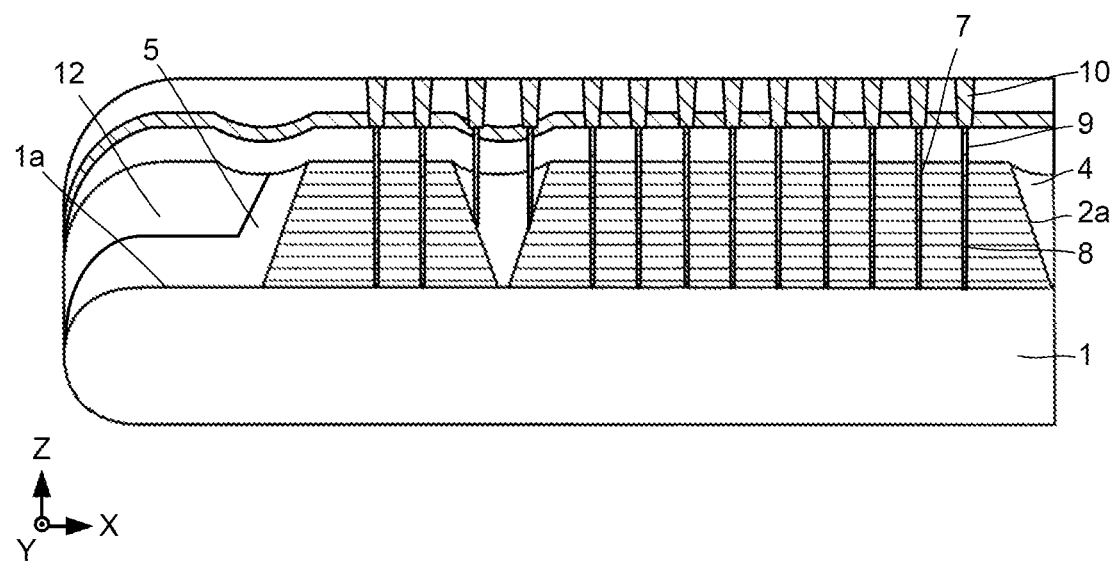
FIG. 26 is a view for explaining the example of the method of manufacturing the semiconductor device in the second embodiment.

Then, as illustrated in FIG. 25, the protective film 3 on the stacks 2a and the protective film 14 are removed to make the top surfaces of the stacks 2a exposed. Thereafter, as illustrated in FIG. 26, as in the first embodiment, the memory holes 7, the memory layers 8, the contact layers 9, and the wiring layers 10 are formed. Steps caused by the dishing 17 and the dishing 18 are flattened during the CMP process when forming the contact layer 9 and wiring layer 10 as in the first embodiment.

As above, in the example of the method of manufacturing the semiconductor device in this embodiment, forming the protective film 14 that overlaps the end portion of the surface 1a of the semiconductor substrate 1 makes it possible to form a sufficiently thick insulating film at the end portion of the surface 1a of the semiconductor substrate 1.

In the case where the protective film 14 is not formed, the insulating film at the end portion of the surface 1a of the semiconductor substrate 1 is removed significantly. In this case, during the process of forming the contact layer 9 and the wiring layer 10, when CMP is performed, pressure is concentrated at the multilayer film edge cut end X and the roll-off region E is formed. When the roll-off region E is formed, focus shift (defocusing) occurs during exposure in the photolithography process when forming the contact layer 9 and the wiring layer 10, which are formed in the subsequent step, causing a decrease in yield at the end portion of the semiconductor substrate 1.

In contrast to this, in the method of manufacturing the semiconductor device in this embodiment, forming the protective film 14 allows a sufficiently thick insulating film to remain on the outer side from the multilayer film edge cut end X. This prevents the formation of the roll-off region E in the subsequent CMP process and prevent the decrease in yield caused by defocusing in the photolithography process. Accordingly, it is possible to provide a semiconductor device with high reliability.

Further, by making the interval F between the adjacent stacks 2a and protective films 3 sufficiently narrow, the same effect as in the manufacturing method in the first embodiment can be achieved with a smaller number of steps compared to the manufacturing method in the first embodiment by forming only the protective film 14 without forming the protective film 11. In order to reduce the step caused by the dishing 18 until it can be flattened when forming the contact layer 9 and wiring layer 10, the interval F between the adjacent protective films 3 is preferred to be 500 μm or less.

This embodiment can be combined with another embodiment appropriately.

Third Embodiment

FIG. 27 to FIG. 30 are views for explaining an example of a method of manufacturing a semiconductor device in a third embodiment. Explanations of the same parts as in the first embodiment are omitted here because the explanation of the first embodiment can be cited as appropriate.

Figure 27:
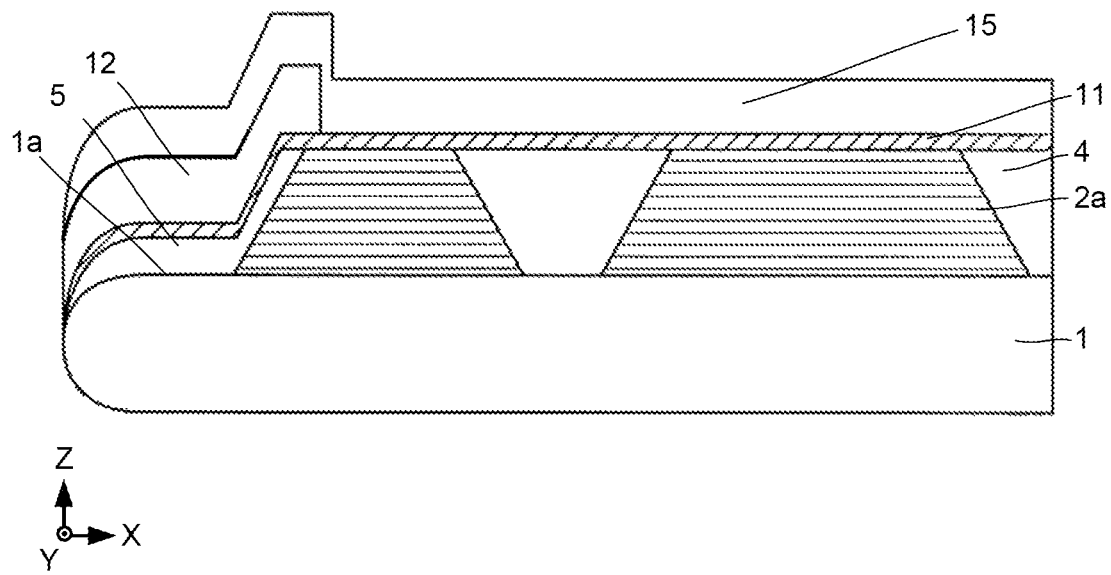
FIG. 27 is a view for explaining an example of a method of manufacturing a semiconductor device in a third embodiment.

First, regarding the steps in FIG. 1 to FIG. 10 in the first embodiment, the same steps as those in the first embodiment are performed. Then, as illustrated in FIG. 27, the insulating film 15 is formed on the insulating film 12 and the protective film 11. Examples of the insulating film 15 include a silicon oxide film having a thickness of 250 nm.

Figure 28:
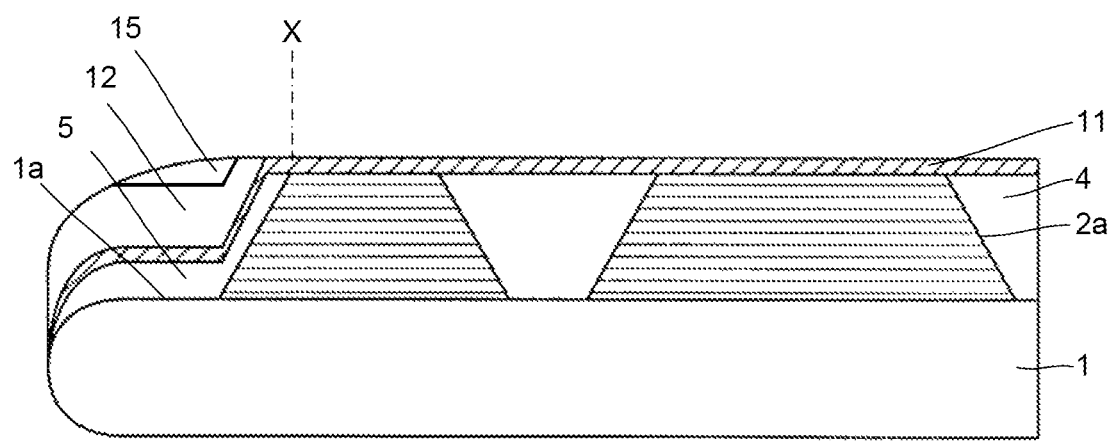
FIG. 28 is a view for explaining the example of the method of manufacturing the semiconductor device in the third embodiment.

Then, as illustrated in FIG. 28, using CMP, the insulating film 12 and the insulating film 15 are partially removed along the thickness direction (Z-axis direction) until, for example, a part of the top surface of the protective film 11 is exposed. At this time, a part of the insulating film 12 remains at the end portion of the surface 1a of the semiconductor substrate, and thus the steep step existing on the end portion side of the multilayer film edge cut end X is alleviated.

Figure 29:
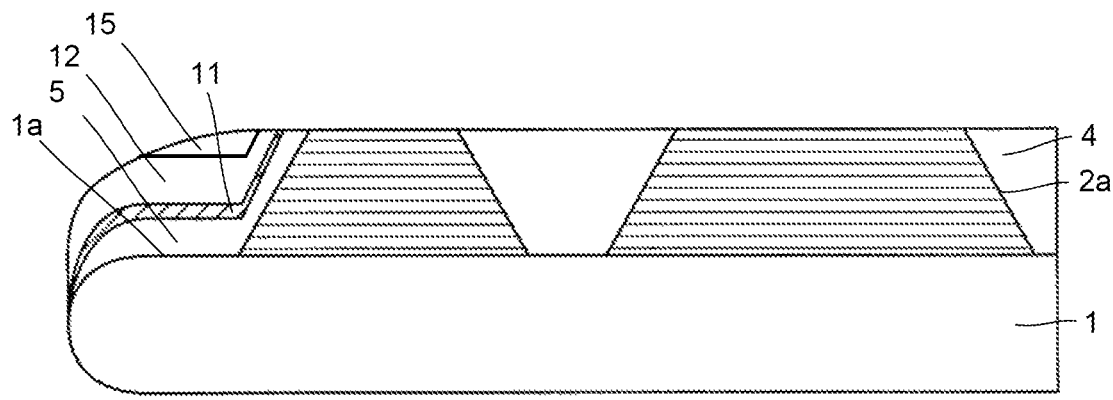
FIG. 29 is a view for explaining the example of the method of manufacturing the semiconductor device in the third embodiment.
Figure 30:
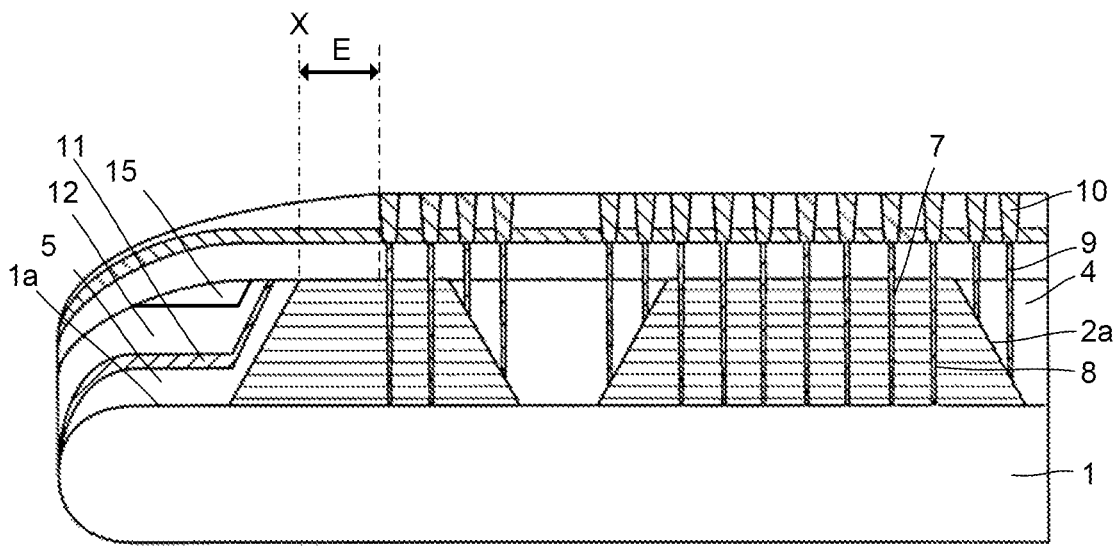
FIG. 30 is a view for explaining the example of the method of manufacturing the semiconductor device in the third embodiment.

Then, as illustrated in FIG. 29, the protective film 11 is partially removed to make the top surfaces of the stacks 2a exposed. The protective film 11 is removed by dry etching, for example. Thereafter, as illustrated in FIG. 30, as in the first embodiment, the memory holes 7, the memory layers 8, the contact layers 9, and the wiring layers 10 are formed.

As above, in the example of the method of manufacturing the semiconductor device in this embodiment, forming the protective film 11 that overlaps the end portion of the surface 1a of the semiconductor substrate 1 makes it possible to form a sufficiently thick insulating film at the end portion of the surface 1a of the semiconductor substrate 1.

In the case where the protective film 11 is not formed, the insulating film at the end portion of the surface 1a of the semiconductor substrate 1 is removed significantly. In this case, during the process of forming the contact layer 9 and the wiring layer 10, when CMP is performed, pressure is concentrated at the multilayer film edge cut end X and the roll-off region E is formed. When the roll-off region E is formed, focus shift (defocusing) occurs during exposure in the photolithography process when forming the contact layer 9 and the wiring layer 10, which are formed in the subsequent step, causing a decrease in yield at the end portion of the semiconductor substrate 1.

In contrast to this, in the method of manufacturing the semiconductor device in this embodiment, forming the protective film 11 allows the insulating film to remain on the outer side from the multilayer film edge cut end X. This prevents the formation of the roll-off region E in the subsequent CMP process and prevent the decrease in yield caused by defocusing in the photolithography process. Further, the formation of the protective film 11 prevents the dishing in the CMP process. Accordingly, it is possible to provide a semiconductor device with high reliability.

Further, at least a part of the effect of the first embodiment can be achieved with a smaller number of steps compared to the first embodiment by forming only the protective film 11 without forming the protective film 14.

This embodiment can be combined with another embodiment as appropriate.

Fourth Embodiment

Figure 31:
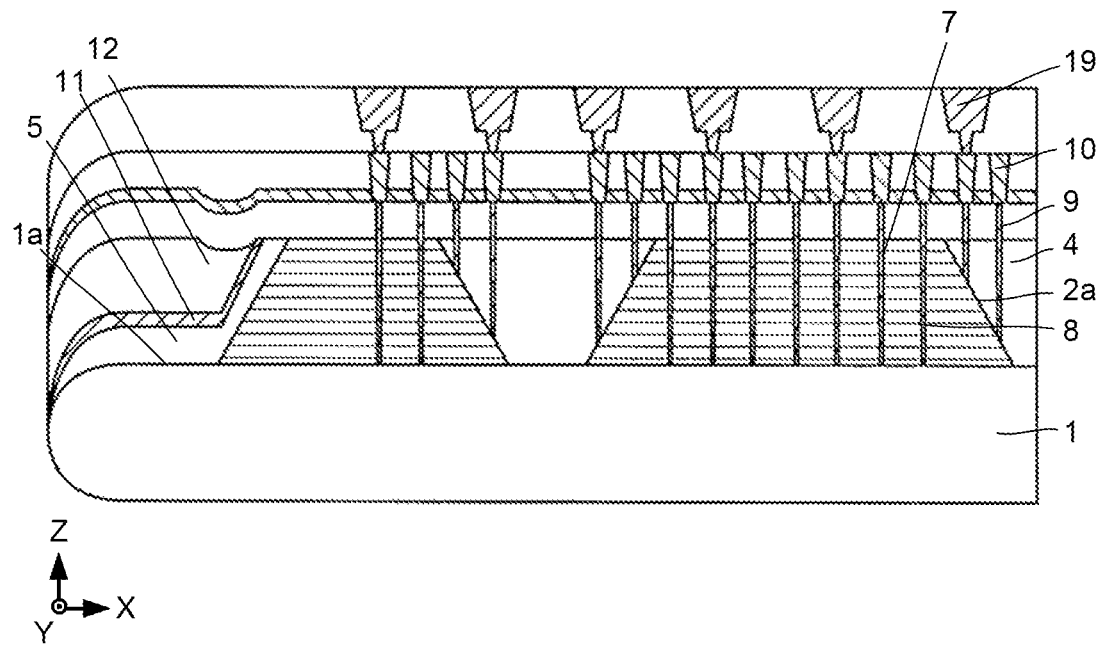
FIG. 31 is a view for explaining an example of a method of manufacturing a semiconductor device in a fourth embodiment.
Figure 32:
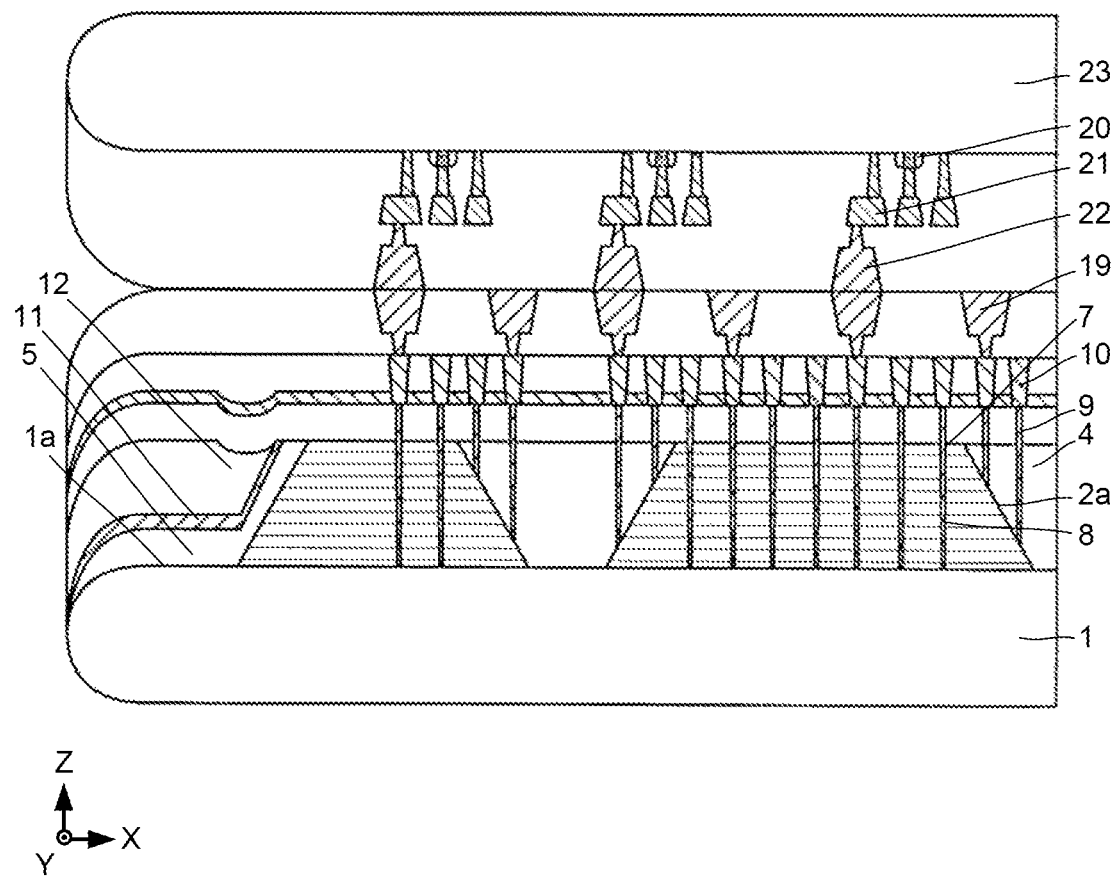
FIG. 32 is a view for explaining the example of the method of manufacturing the semiconductor device in the fourth embodiment.

FIG. 31 and FIG. 32 are views for explaining an example of a method of manufacturing a semiconductor device in a fourth embodiment. In the example of the method of manufacturing the semiconductor device in the fourth embodiment, as an example, the memory holes 7, the memory layers 8, the contact layers 9, and the wiring layers 10 are formed on the semiconductor substrate 1 by going through the steps from FIG. 1 to FIG. 18 in the first embodiment.

Then, as illustrated in FIG. 31, connection pads 19 connected to the wiring layers 10 are formed on the wiring layers 10. The fourth embodiment is not limited to this, and the semiconductor device may be manufactured by using the manufacturing methods in the second embodiment and the third embodiment.

Then, as illustrated in FIG. 32, a semiconductor substrate 23 is prepared, which includes elements 20 configuring peripheral circuits such as a CMOS circuit, wiring layers 21 provided on the elements 20 and connected to the elements 20, and connection pads 22 provided on the wiring layers 21 and connected to the wiring layers 21. Thereafter, the semiconductor substrate 1 and the semiconductor substrate 23 are bonded together with the connection pads 19 and the connection pads 22 facing each other, and thereby, the memory layers 8 of the semiconductor substrate 1 and the elements 20 of the semiconductor substrate 23 are electrically connected.

In the example of the method of manufacturing the semiconductor device in this embodiment, the semiconductor device is manufactured by bonding the semiconductor substrate 1 manufactured by using the manufacturing method in the first embodiment, the second embodiment, or the third embodiment and the semiconductor substrate 23 together.

Figure 33:
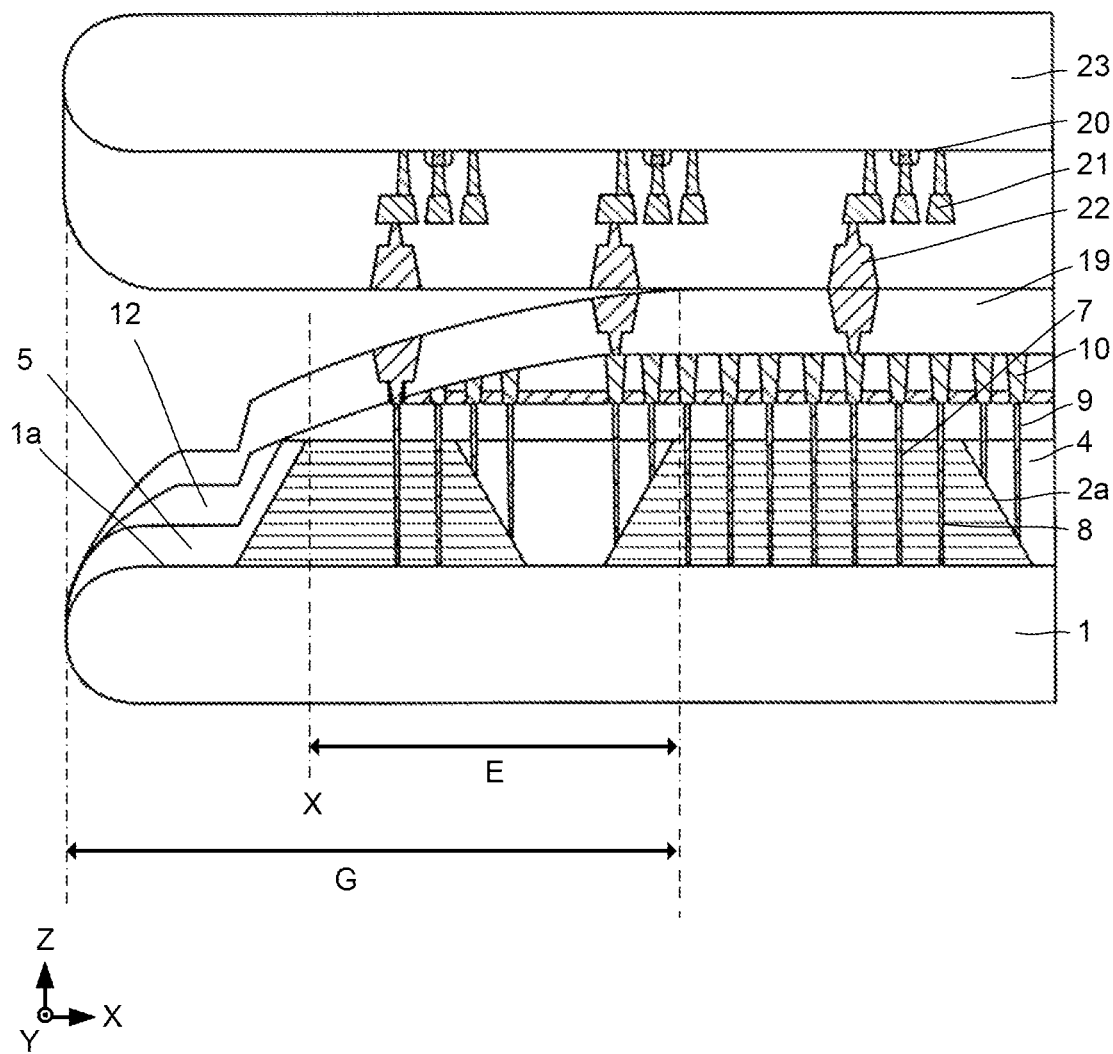
FIG. 33 is a schematic view illustrating an example of a structure of a semiconductor device in which a semiconductor substrate 1 manufactured without forming the protective film 11 or the protective film 14 and a semiconductor substrate 23 are bonded together.

FIG. 33 is a schematic view illustrating an example of a structure of the semiconductor device in which the semiconductor substrate 1 manufactured without forming the protective film 11 or the protective film 14 and the semiconductor substrate 23 are bonded together. In the case where neither the protective film 11 nor the protective film 14 is formed, the insulating film at the end portion of the surface 1a of the semiconductor substrate 1 is removed significantly. In this case, during the process of forming the contact layer 9 and the wiring layer 10, when CMP is performed, pressure is concentrated at the multilayer film edge cut end X and the roll-off region E is formed. Therefore, an unbonded region G is formed at the end portion of the semiconductor substrate 1. This causes a decrease in the reliability of the semiconductor device.

In contrast to this, in the example of the method of manufacturing the semiconductor device in this embodiment, the semiconductor substrate 1 where the formation of the roll-off region E is prevented and the semiconductor substrate 23 are bonded together, and thus the unbonded region G can be reduced, resulting in that it is possible to widen an effective region where a semiconductor product can be formed.

While certain embodiments of the present invention have been described, these embodiments have been presented by way of example only, and are not intended to limit the scope of the inventions. The novel embodiments described herein may be embodied in a variety of other forms; furthermore, various omissions, substitutions and changes may be made therein without departing from the spirit of the inventions. The accompanying claims and their equivalents are intended to cover such forms or modifications as would fall within the scope and spirit of the inventions.

What is claimed is:

1. A method of manufacturing a semiconductor device, comprising:
   alternately stacking a first film and a second film on a silicon wafer to form a multilayer film;
   partially removing the multilayer film to form stacks and a depression between one of the stacks and another one of the stacks and expose an edge of the silicon wafer;
   forming a first insulating film to fill the depression, the first insulating film being on the edge directly;
   forming a second insulating film above the edge and above the stacks;
   forming a second protective film on the second insulating film, the second protective film overlapping the edge and not overlapping the stacks; and
   partially removing the second insulating film in a thickness direction using chemical mechanical polishing after forming the second protective film.

2. The method according to claim 1, wherein the second protective film includes a silicon nitride film.

3. The method according to claim 1, wherein the first film is a silicon oxide film, and the second film is a silicon nitride film.

4. The method according to claim 1, wherein the first and second insulating films each include a silicon oxide film.

5. The method according to claim 4, further comprising:
   forming a third insulating film on the second insulating film before partially removing the second insulating film using the chemical mechanical polishing.

6. The method according to claim 5, wherein the third insulating film includes a silicon oxide film.

7. The method according to claim 1, further comprising:
forming a memory layer through the one of the stacks; and
removing the second film to form a space and forming a conductive layer in the space.

8. The method according to claim 7, further comprising:
forming a first connection pad above the memory layer; and
bonding the silicon wafer and a second semiconductor substrate via the memory layer and the first connection pad, the second semiconductor substrate including a second connection pad, the first connection pad and the second connection pad facing on each other.

9. A method of manufacturing a semiconductor device, comprising:
alternately stacking a first film and a second film on a silicon wafer to form a multilayer film;
partially removing the multilayer film to form stacks and a depression between one of the stacks and another one of the stacks and expose an edge of the silicon wafer;
forming a first insulating film to fill the depression, the first insulating film being on the edge directly;
forming a first protective film on the first insulating film and above the edge;
forming, on the first protective film, a second insulating film overlapping at least a part of the another one of the stacks and the edge;
forming a second protective film on the second insulating film, the second protective film overlapping the edge and not overlapping the stacks; and
partially removing the second insulating film in a thickness direction using chemical mechanical polishing.

10. The method according to claim 9, wherein the first protective film includes a silicon nitride film.

11. The method according to claim 9, wherein a top of the second protective film is flush with a top of the first protective film.

12. The method according to claim 9, wherein the second protective film includes a silicon nitride film.

13. The method according to claim 9, wherein the first film is a silicon oxide film, and the second film is a silicon nitride film.

14. The method according to claim 9, wherein the first and second insulating each include a silicon oxide film.

15. The method according to claim 14, further comprising:
forming a third insulating film on the second insulating film before partially removing the second insulating film using the chemical mechanical polishing.

16. The method according to claim 15, wherein the third insulating film includes a silicon oxide film.

17. The method according to claim 9, further comprising:
forming a memory layer through the one of the stacks; and
removing the second film to form a space and forming a conductive layer in the space.

18. The method according to claim 17, further comprising:
forming a first connection pad above the memory layer; and
bonding the silicon wafer and a second semiconductor substrate via the memory layer and the first connection pad, the second semiconductor substrate including a second connection pad, the first connection pad and the second connection pad facing on each other.

* * * * *